US009860634B2

United States Patent
Norris et al.

(10) Patent No.: US 9,860,634 B2
(45) Date of Patent: Jan. 2, 2018

(54) HEADSET WITH END-FIRING MICROPHONE ARRAY AND AUTOMATIC CALIBRATION OF END-FIRING ARRAY

(71) Applicant: Creative Technology Ltd, Singapore (SG)

(72) Inventors: John Norris, Los Angeles, CA (US); Robert Bliss, Soquel, CA (US)

(73) Assignee: Creative Technology Ltd, Singapore (SG)

( * ) Notice: Subject to any disclaimer, the term of this patent is extended or adjusted under 35 U.S.C. 154(b) by 0 days.

(21) Appl. No.: 14/899,447

(22) PCT Filed: Jun. 18, 2014

(86) PCT No.: PCT/US2014/043045
§ 371 (c)(1),
(2) Date: Dec. 17, 2015

(87) PCT Pub. No.: WO2014/205141
PCT Pub. Date: Dec. 24, 2014

(65) Prior Publication Data
US 2016/0142815 A1    May 19, 2016

Related U.S. Application Data

(60) Provisional application No. 61/836,652, filed on Jun. 18, 2013.

(51) Int. Cl.
*H04R 1/40* (2006.01)
*H04R 1/10* (2006.01)
*H04R 3/00* (2006.01)
*H04R 29/00* (2006.01)
*G10L 21/0216* (2013.01)
(Continued)

(52) U.S. Cl.
CPC .......... *H04R 1/406* (2013.01); *G10L 21/0216* (2013.01); *H03G 5/165* (2013.01); *H04R 1/1083* (2013.01); *H04R 3/005* (2013.01); *H04R 29/005* (2013.01); *H04R 29/006* (2013.01); *G10L 2021/02168* (2013.01); *H04R 3/04* (2013.01); *H04R 2201/107* (2013.01); *H04R 2430/03* (2013.01)

(58) Field of Classification Search
None
See application file for complete search history.

(56) References Cited

U.S. PATENT DOCUMENTS

2003/0031328 A1*  2/2003  Elko ............... H04R 1/406
                                           381/92
2008/0019548 A1   1/2008  Avendano
(Continued)

FOREIGN PATENT DOCUMENTS

| EP | 0652686 A1 | 5/1995 |
| EP | 1278395 A2 | 1/2003 |
| WO | 2007/106399 A2 | 9/2007 |

*Primary Examiner* — Paul Huber
(74) *Attorney, Agent, or Firm* — Russell Swerdon; Desmund Gean

(57) ABSTRACT

In one invention embodiment two microphones are attached to the ear cup and are configured as an end-firing array. The end-firing array suppresses unwanted sounds using an adaptive spectral method and spectral subtraction. According to a second embodiment, Automatic Calibration of an end-firing Microphone Array is provided.

12 Claims, 11 Drawing Sheets

(51) Int. Cl.
   *H03G 5/16* (2006.01)
   *H04R 3/04* (2006.01)

(56) References Cited

U.S. PATENT DOCUMENTS

| | | | |
|---|---|---|---|
| 2008/0260175 A1* | 10/2008 | Elko | H04R 3/005 |
| | | | 381/73.1 |
| 2009/0106021 A1 | 4/2009 | Zurek et al. | |
| 2015/0213811 A1* | 7/2015 | Elko | H04R 3/005 |
| | | | 381/92 |

* cited by examiner

Figure 1
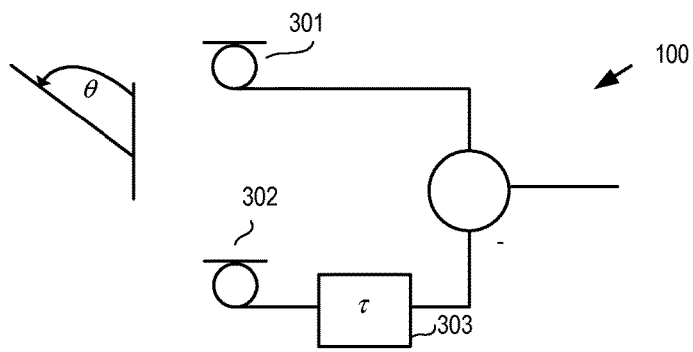
Figure 2A
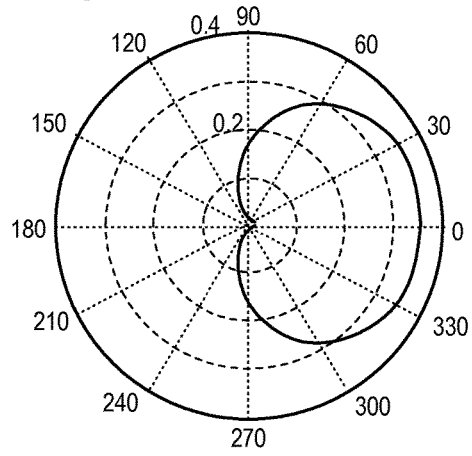
Figure 2B HYPERDCARDIOID
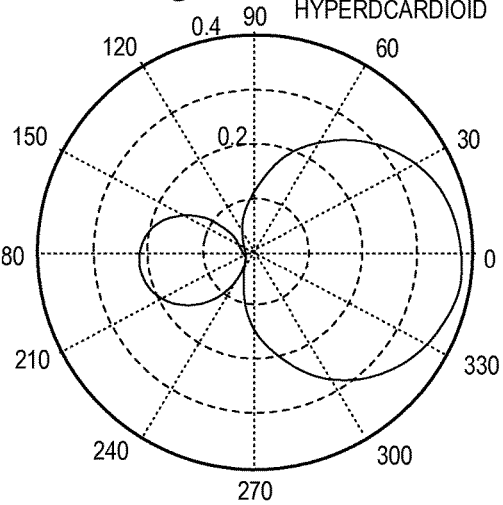
Figure 2C SUPERCARDIOID
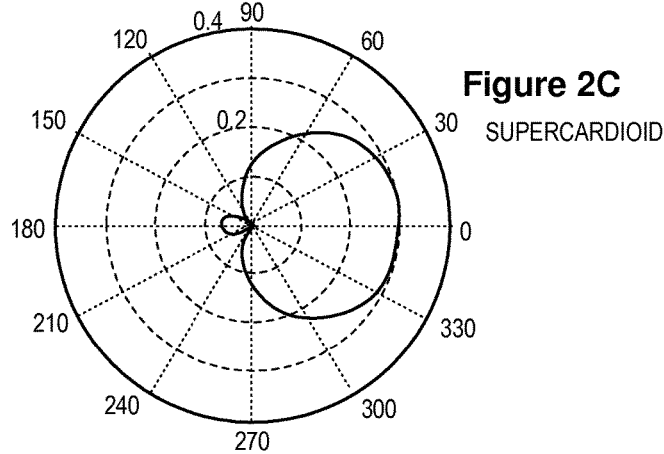

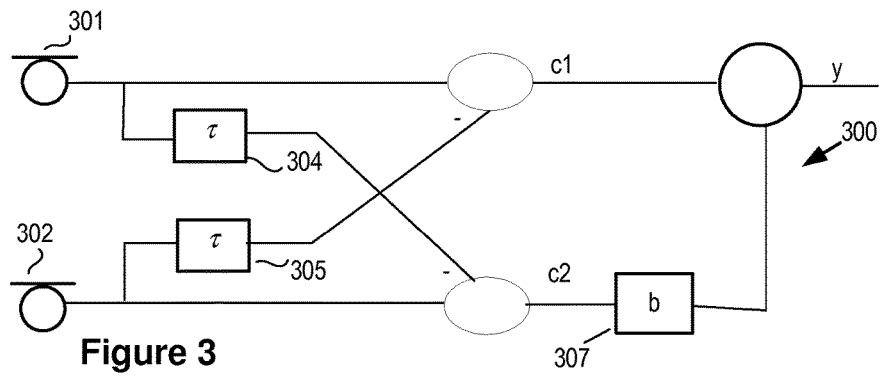
Figure 3
Figure 4A
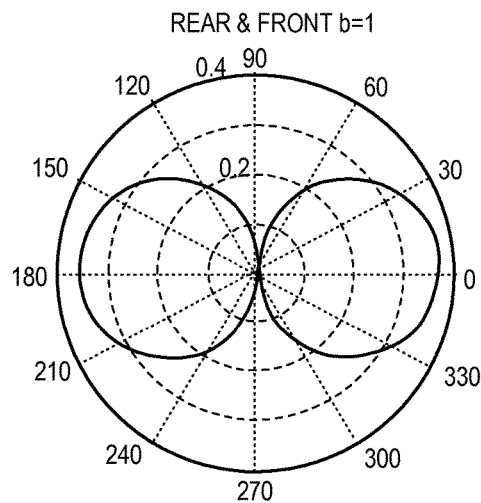
Figure 4B
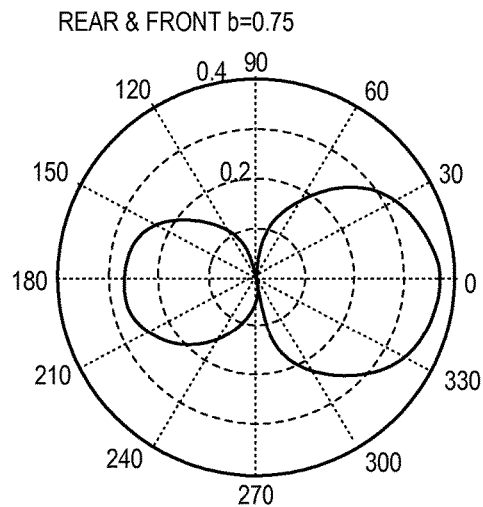
Figure 4C
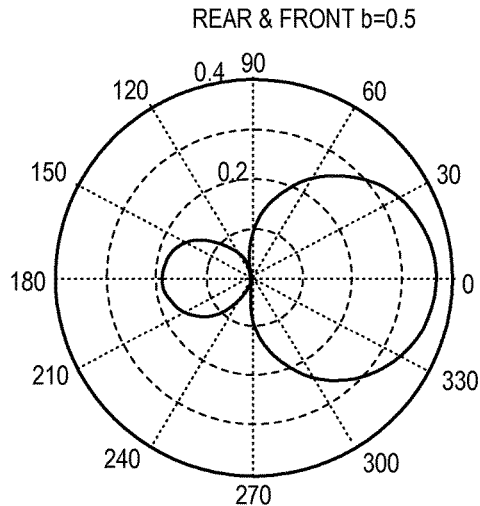
Figure 4D
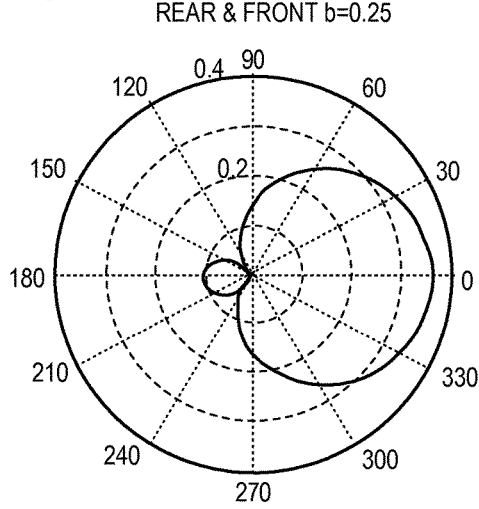

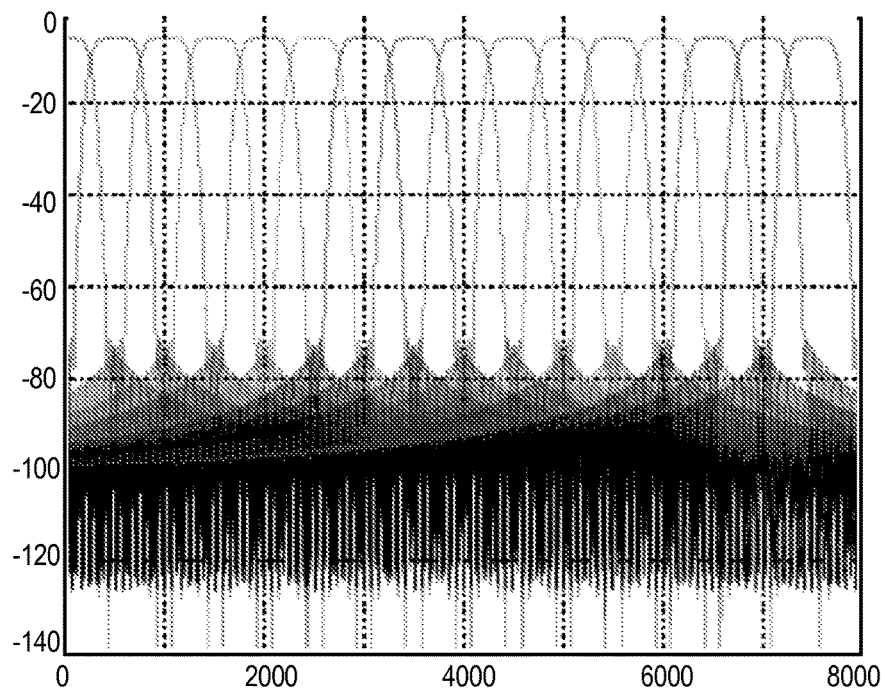
Figure 15   FREQUENCY
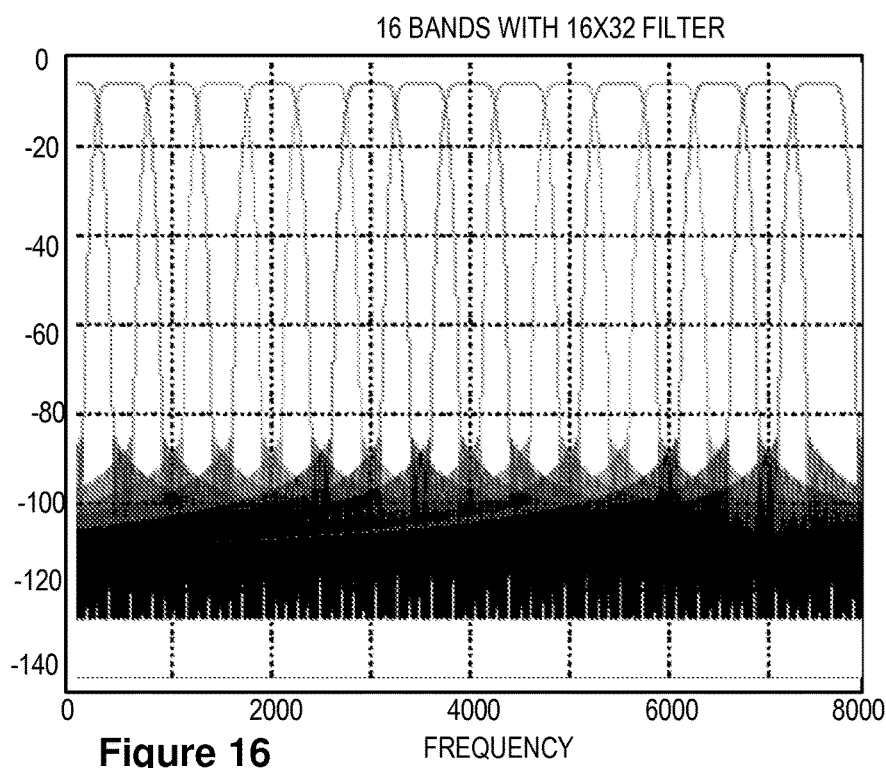
Figure 16   FREQUENCY

HEADSET WITH END-FIRING MICROPHONE ARRAY AND AUTOMATIC CALIBRATION OF END-FIRING ARRAY

BACKGROUND OF THE INVENTION

1. Field of the Invention

The present invention relates in one embodiment to a dual microphone end firing array. A standard headset consists of an ear cup with a microphone pickup arm. In this invention embodiment two microphones are attached to the ear cup and are configured as an end firing array. The end firing array suppresses unwanted sounds using an adaptive spectral method and spectral subtraction. According to a second embodiment, automatic calibration of an end-firing microphone array is provided.

2. Background for Arrays

Current ending firing implementations create directional nulls in the directivity pattern of the microphone array. In a reverberate environment the noise source may not come from a single direction. Accordingly, what is needed is an effective and simple system and method to improve the pickup of desired audio signals.

In a system with 2 or more microphones, which has subsequent signal processing, a proper balance of the microphones may be required for the subsequent signal processing to perform within design parameters. Existing solutions to the balance problem are: a) careful selection of matched microphones; or b) manual calibration by injection of a diagnostic tone, measurement, and persistent storage of the compensation coefficient. In contrast, a present invention embodiment features an automatic and continuous calibration of an unmatched pair of microphones arranged in a known configuration to be used with an input source in a known location, e.g. a pair of headphones.

A standard headset consists of one (or two) ear cups and a microphone pickup arm. The arm positions a microphone in front of the user's mouth and picks up the user's voice and back ground noises. Placing the microphone close to the wearer's mouth allows the user's voice to be heard over most background sounds. The drawback is that these headsets can be annoying to wear.

Reference Signals

In this application we propose a method to replace the microphone arm with microphones placed on the ear cup of the headset. To reduce the background noise and improve the near field voice pickup we use an end firing dual microphone array. The microphones are configured to create two cardioid arrays. The null of the rear facing cardioid is positioned to point in the direction of the desired signal and the front cardioid's null points in the opposite direction. The rear facing cardioid signal is used as a reference signal to determine any similarities with the front cardioid. We then subtract any similarities knowing that the front facing cardioid is the only signal that contains direct speech. We use a frequency based adaptive method to estimate these similarities with the adaption updating only when there is no direct speech detected. For residual suppression we use spectral subtraction. Spectral subtract is also used when speech is detected to remove background noises.

End Firing Algorithm

The end firing arrays have been used in Bluetooth headsets and hearing aids to pick up the user's voice while helping to suppress the back ground noise. In this section we review some of the current methods. One method can be described as a null-forming scheme where a null in the directivity pattern is steered in the direction of the noise source. Another method, however, is to create a noise reference signal from the array which is then subtracted from the desired signal. We begin by discussing the cardioid array as we use this array.

Cardioid

Two omnidirectional microphones can be used to create a directional microphone by adding a delay $\tau$ to one of them. For example, in FIG. 1, the end firing array 100 includes front microphone 301 and rear microphone 302 having a distance d between them. A delay block 303 is used to create a directional microphone. If we consider a plane sound wave $P_0(w)e^{(iwt-k \cdot r)}$ arriving from a direction $\theta$, then for two omnidirectional microphones placed a distance d apart their pressure difference is $$P(w, \theta) = P_0(w)\left(1 - e^{-jw\left(\tau + \frac{d}{c}\cos\theta\right)}\right) \quad [2.1]$$

$$P(w, \theta) = 2jP_0(w)e^{-j\frac{w}{2}\left(\tau + \frac{d}{c}\cos\theta\right)}\sin\left(\frac{w}{2}\left(\tau + \frac{d}{c}\cos\theta\right)\right) \quad [2.2]$$

$$|P(w, \theta)| = 2P_0(w)\left|\sin\left(\frac{w}{2}\left(\tau + \frac{d}{c}\cos\theta\right)\right)\right| \quad [2.3]$$

If we let the delay $$\tau = \frac{d}{c},$$

where c is the speed of sound and d is the distance between the microphones, then we get the directivity pattern shown in FIG. 2A, the cardioid. By varying the delay $\tau$ we obtain different directivity patterns, see FIGS. 2B and 2C where for FIG. 2B $\tau=d/3c$ (hypercardioid) and for FIG. 2C $\tau=2d/3c$ (supercardioid). We can see from these figures that by varying $\tau$ we can change the position of the null. Thus, if we know that a sound (noise) comes from a fixed direction, and wish to suppress it, then we can adjust the value of $\tau$ to move the null to that direction. Creating a directional microphone using delays and summing has been known.

We saw that we can steer a null to a certain direction by adjusting the delay. In a digital system this would require us to implement a fractional interpolator, we can avoid this if we use two omnidirectional microphones to form front and back dual microphone end firing arrays, see FIG. 3. Two delay blocks 104 and 105 are used in addition to gain bloc "b" (107. For example let $$y(t) = c_1(t) - b^* c_2(t) \quad [2.4]$$

then for b=1 we get FIG. 4A. As we vary b in the interval $0 \le b \le 1.0$ we can adjust the position of the null angle $\theta$ between $\pi/2 \le \theta \le \pi C$. In a digital system it is easier to vary the gain rather than a fractional delay. (FIG. 4 shows front and rear cardioids for b=1.0 (FIG. 4A); b=0.75 (FIG. 4B); b=0.5 (FIG. 4C); and b=0.25 9 FIG. 4D).

If we let $$\tau = \frac{c}{d}$$

then the expressions for the front and rear cardioid signals are $$c_f = 2jP_0(w)e^{-j\frac{kd}{2}(1+\cos\theta)}\left(\sin\left(\frac{kd}{2}(1+\cos\theta)\right)\right) \quad [2.5]$$

$$c_r = 2jP_0(w)e^{-j\frac{kd}{2}(1-\cos\theta)}\left(\sin\left(\frac{kd}{2}(1-\cos\theta)\right)\right) \quad [2.6]$$

where k is the wave number k=ω/c.

In FIG. 5 we show an adaptive signal processing method to adjust the value of the parameter b in Eq 2.4. FIG. 5 shows adaptive front and back dual microphones 301, 302; the delay blocks 304, 305; and the adaptive gain adjustment block 308. The desired signal is contained in the front facing cardioid array and not in the rear. But the front facing cardioid contains speech plus ambient noise while the rear contains ambient noise and reflected speech. To reduce the ambient noise we can find the cross correlation between y and cr, see Eq 2.4. We can use the well known normalized least mean square (LMS) to do this. This normalized adaptive method reduces the least mean square $E(y^2)$ by using the method of steepest descent to find a minimum. That is, small changes are made to the adjustable parameters to reduce $E(y^2)$. In Eq 2.4 we only have one parameter to adjust, b to reduce the cross correlation between y and cr. The normalized adaptive method reduces the least mean square $E(y^2)$ by using the update $$b = b + \mu\frac{y(n)*cr(n)}{\Sigma(cr^2)} \quad [2.7]$$

for b, where μ is a small parameter and $\Sigma(cr^2)$ is the averaged smoothed power of cr. In the above method we have a single parameter b that we can change to reduce the ambient noise. If we band pass the signals, creating say 8 bands then we can use 8 coefficient $b_0, b_1, \ldots, b_7$ and the LMS algorithm 2.7 for each band to adjust $b_i$, to improve the suppression. This method can be used to create nulls in each of the bands.

In FIG. 6 we show a range of frequency sweeps for four different angular directions, θ=0°, 30°, 60° and 90° (see 602, 604, 606, and 608). It illustrates a plot of the variation of the magnitude with frequency for τ=d/c and for θ=0°, 30°, 60° and 90°. Thus as the speaker moves out of the lobe of the pickup directivity pattern the signal is suppressed. From these sweeps we see that by equalizing the microphone signal we still preserve this directional behavior, all the curves have the same constant slope. As can been seen in 6 the cardioid acts as a high pass. To compensate for this behavior we equalize the microphone signal by creating a mirror image of the cardioid high pass behavior. FIG. 7 shows a compensate for a cardioid and this is implemented in the box labeled FILTER 511 in FIG. 5 (see also Eq 2.5).

All microphone have some residual noise and by equalizing the cardioid end array this residual noise will be amplified. The closer the microphones are placed together the greater the amplification needed. If we double the spacing between the microphones from 1 cm to 2 cm, for example, we boost the cardioid signal by about 6 dB, requiring less equalization gain. But as the delay τ is determined by the sample rate for convenience the microphones separation is τ*c, where c is the speed of sound.

Up until now we have assumed that the microphones have ideal, flat responses. This is far from true and methods are sometimes need to compensate for the variability. Microphones manufactures normally specify sensitivity at 1 kHz and provide an envelop of variability for frequencies about and below this value. The variability can exceed 10 dB for some frequency values and this will obviously affect the performance of the suppression of the cardioids. In a later section we shall describe a method to match the microphones in a number of different bands and the method used to suppress unwanted noises.

SUMMARY OF THE INVENTION

To achieve the foregoing, the present invention provides an effective and simple system. According to one embodiment, the energy of the rear and front cardioid is used to determine if the adaptive filter should be updated. A polyphase filter bank separates the front and rear cardioid signals into spectral bands. The rear signal is used as a reference to spectral subtract it from the desired signal in an adaptive manner. Also we keep a history of the reference signal so we can cancel reflected noise sounds up to the length of this history. This provides an improvement over existing devices that use an end firing array type to steer a null to the direction of the sound, for example in a hearing aid or blue tooth headset. This implementation uses the rear reference signal to quickly suppress the unwanted noise by spectrally suppressing the unwanted sounds.

According to a second embodiment, Automatic Calibration of an End-firing Microphone Array is provided. This embodiment features an automatic and continuous calibration of an unmatched pair of microphones arranged in a known configuration to be used with an input source in a known location, e.g. a pair of headphones. The benefits include:

a) careful selection of matched microphones is not required b) manual calibration at the point of production (factory) is not required c) manual calibration by the end user (customer) is not required d) persistent storage of the compensation coefficient is not required Applications include consumer electronics and industrial electronics. These and other features and advantages of the present invention are described below with reference to the drawings.

BRIEF DESCRIPTION OF THE DRAWINGS

FIG. 1 is a block diagram illustrating a directional microphone having dual microphones with plane sound pressure arriving at an angle implemented in various embodiments of the present invention.

FIGS. 2A-2C illustrate directivity patterns of the cardioid obtained by varying the delay according to various embodiments of the present invention.

FIG. 3 is a diagram illustrating an end firing array using two omndiretional microphones to form front and back dual microphone end firing arrays n frequency response of a HPF (high-pass filter) according to various embodiments of the present invention.

FIGS. 4A-D illustrate directivity patterns for the front and read cardioids illustrating the variation in null for different values of b in FIG. 3.

FIG. 15 is a plot illustrating spectral bands for 16 bands with a 416 reconstruction filter according to various embodiments of the present invention.

FIG. 16 is a plot illustrating spectral bands for 16 bands with a 512 reconstruction filter according to various embodiments of the present invention.

DETAILED DESCRIPTION OF PREFERRED EMBODIMENTS

Figure 5:
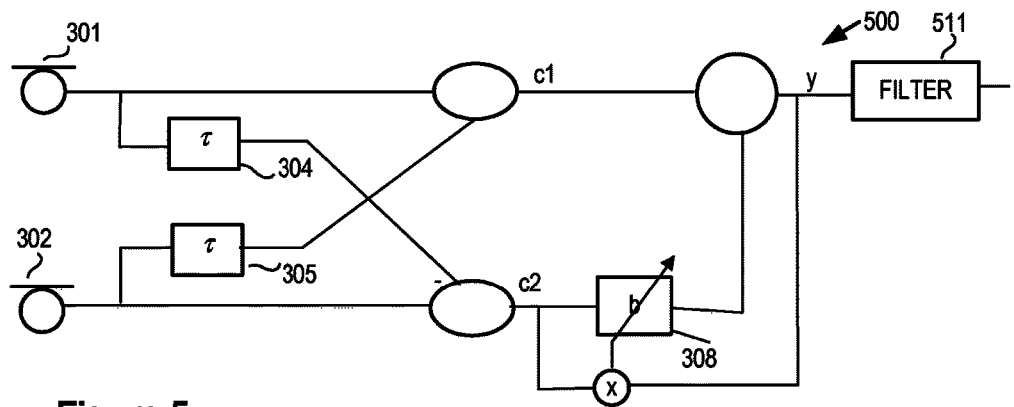
FIG. 5 is a diagram illustrating the implementation of an adaptive signal processor to the dual microphone array according to various embodiments of the present invention.
Figure 6:
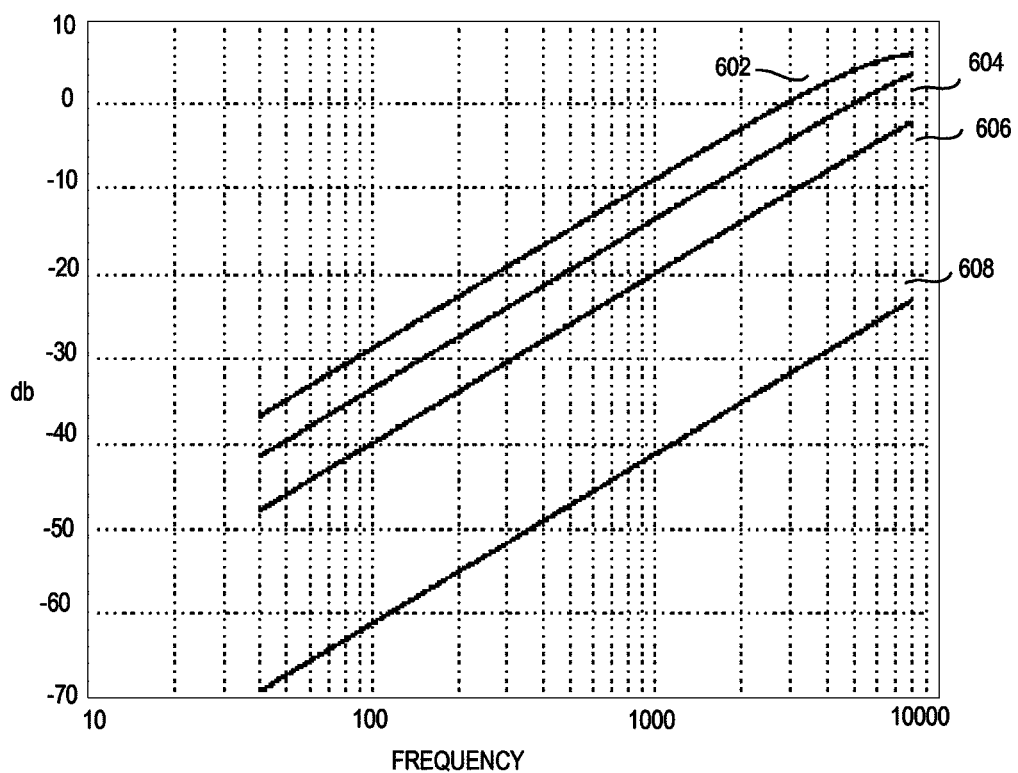
FIG. 6 is a plot showing the variation of magnitude with frequency for four different angular directions according to various embodiments of the present invention.
Figure 7:
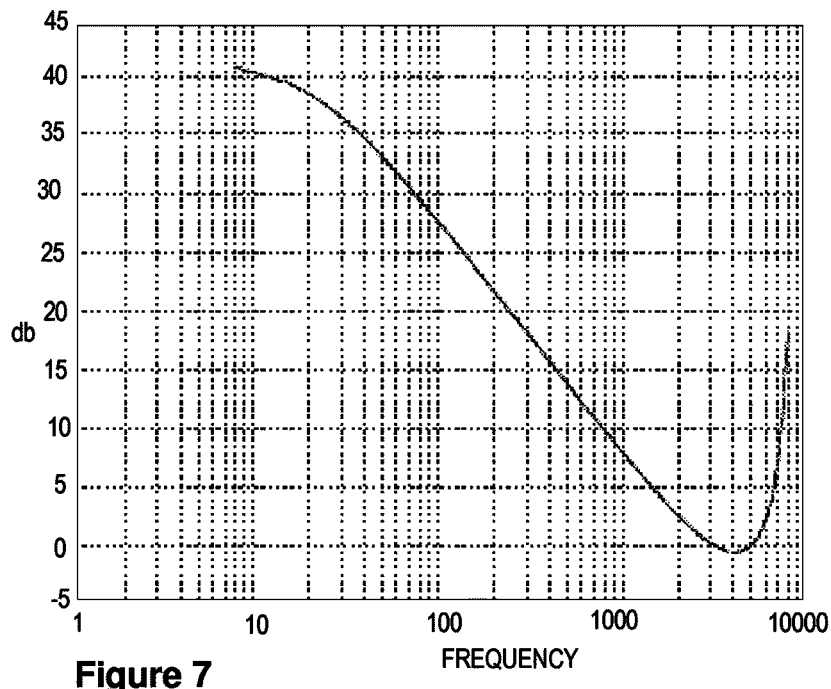
FIG. 7 is a plot illustrating the compensation applied by the filter in FIG. 2, according to various embodiments of the present invention.

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Current ending firing implementations create directional nulls in the directivity pattern of the microphone array. In a reverberate environment the noise source may not come from a single direction. We use the energy of the rear and front cardioid to determine if the adaptive filter should be updated. A polyphase filter bank separates the front and rear cardioid signals into spectral bands. The rear signal is used as a reference to spectral subtract it from the desired signal in an adaptive manner. Also we keep a history of the reference signal so we can cancel reflected noise sounds up to the length of this history. In short, in the first embodiment we provide an improved system and method using the rear signal as a reference and spectral implementation.

To reduce the background noise and improve the near field voice pickup we use an end firing dual microphone array. The microphones are configured to create two cardioid arrays. The null of the rear facing cardioid is positioned to point in the direction of the desired signal and the front cardioid's null points in the opposite direction.

The rear facing cardioid signal is used as a reference signal to determine any similarities with the front cardioid. We then subtract any similarities knowing that the front facing cardioid is the only signal that contains direct speech. We use a frequency based adaptive method to estimate these similarities with the adaption updating only when there is no direct speech detected. For residual suppression we use spectral subtraction. Spectral subtract is also used when speech is detected to remove background noises. In a previous section we described how to create nulls in the directivity pattern using two cardioids; we also showed how to do this for different frequency bands by band passing the cardioid signals. When the user is in a enclosed environment the noise source is reflected and its reverberant energy can be high causing the noise to persist and come from multiple directions. In this section we describe a different method where we do not try to steer a null but instead use the rear cardioid as a reference signal which we subtract from the front cardioid. We do this in an adaptive method using a sub band spectral method. Each of the spectral bands have a history which is used to try and suppress reflected sounds and reverberate tails. When the front facing cardioid points towards someone talking (the user) their speech will be in the null of the rear facing cardioid array. Therefore the rear array will pick up ambient noises and reflected user speech. The front facing array picks up user speech, reflected user speech and ambient noise. The rear facing array signal can be used to reduce the ambient noise and reflected speech in the front facing signal to improve speech intelligibility. In this case we are not trying to create a null in the direction of the noise source but are instead using the rear facing end firing signal as a reference signal which we wish to subtract from the front facing signal.

Adaptive End Firing Algorithm

Figure 8:
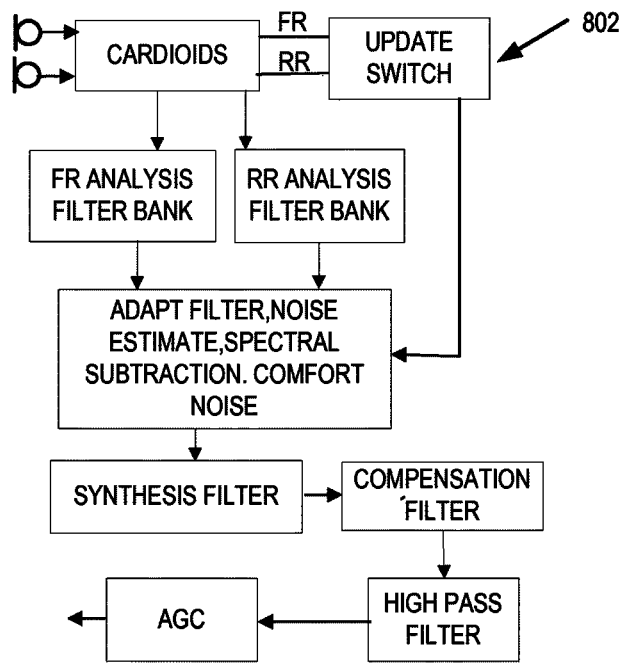
FIG. 8 is a flowchart illustrating the end firing noise suppression algorithm according to various embodiments of the present invention.

In FIG. 8 we show the control flow of the end firing adaptive algorithm. We start by creating the cardioid signals by introducing a one sample delay. These signals are smoothed in the Update Switch Box 802 using the method described in the following two sections.

UpdateSwitch Signal Detect

Figure 9:
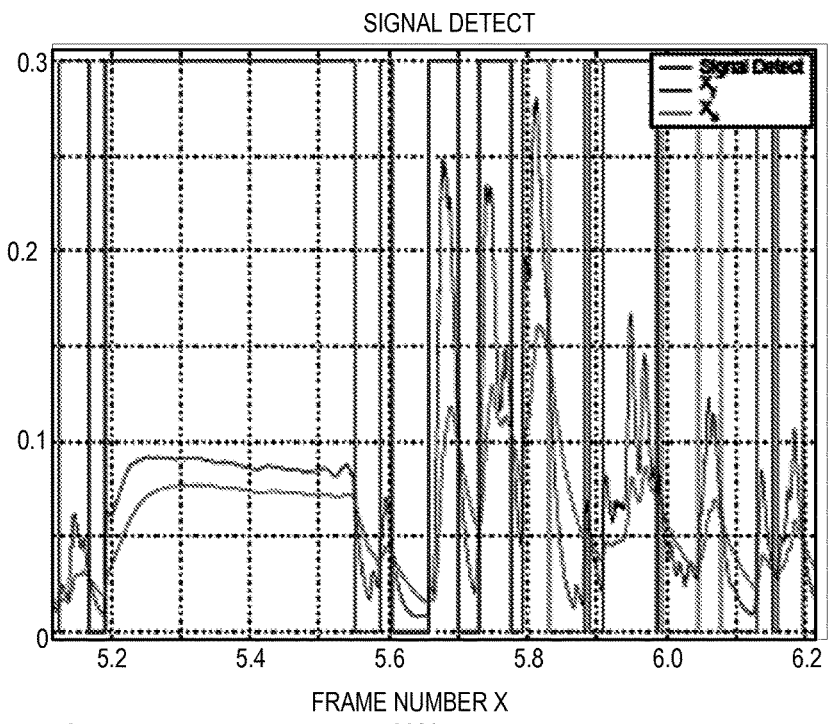
FIG. 9 is a plot illustrating the signal detect switch effect according to various embodiments of the present invention.
Figure 10:
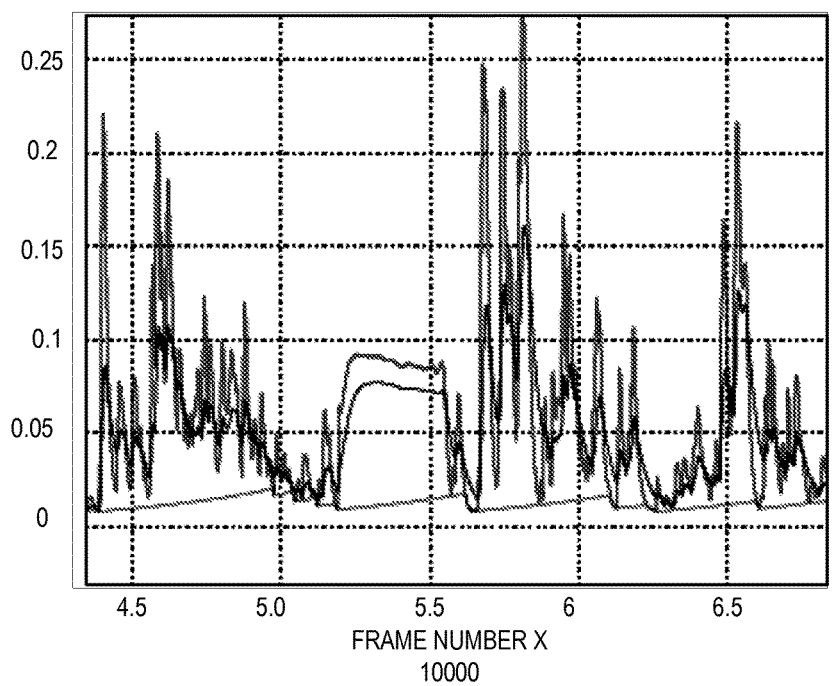
FIG. 10 is a plot illustrating the fast, slow, and noise floor signals for the front cardioid according to various embodiments of the present invention.
Figure 11:
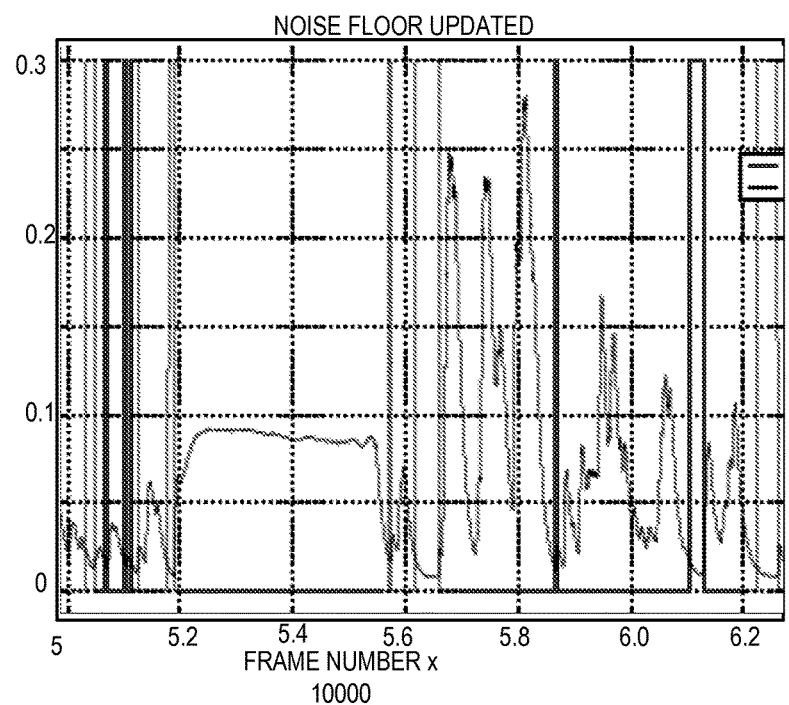
FIG. 11 is a plot illustrating the switch triggering the updating of the spectral noise floor estimate according to various embodiments of the present invention.

The signal detect routine uses the magnitude of the front cardioid signal to calculate $X_s$ and $X_f$ where $$g=(X_s<|x(n)|)?G0_s:G1_s; \qquad [4.1]$$

and $$X_s = g*X_s + (1-g)*|x(n)| \quad [4.2]$$

and for $X_f$ $$g = (X_f < |x(n)|?G0_f:G1_f; \quad [4.3]$$

and $$X_f = g*X_f + (1-g)*|x(n)| \quad [4.4]$$

where $G0_f \le G1_f, G0_s \le G1_s$; So the signal $X_f$ adapts to variations in $\|x\|$ more quickly than $X_s$. So when $X_s \le X_f$ there is a signal, see FIG. 9, otherwise there isn't. There is an additional condition that the signal magnitude must be above some noise threshold for it to be flagged as active. We determine the noise floor using the following method.

$$\text{NoiseFloor} = \text{MIN}(X_f, \text{NoiseFloor})(1+\epsilon) \quad [4.5]$$

where $\epsilon \ge 0$ is some small positive number used to keep the noise floor from freezing at a particular, see FIG. 10. We use these signals to determine a switch which we plot in FIG. 9 (showing the $X_s$, $X_f$, and signal detect in the plot of the signal detect switch). This switch is the signal detect or VAD. The VAD is given by the following equation $$\text{VAD} = (X_f > \text{MAX}(X_s*(1+\epsilon_1), \text{MAX}(\text{NoiseFloor}*(1+\epsilon_2) \text{MAGNITUDETHRESHOLD}))) \quad [4.6]$$

where $\epsilon_1$ and $\epsilon_2$ are small positive numbers and MAGNITUDETHRESHOLD is the minimum signal magnitude. We also use these signals to determine when the signal is back ground noise (DBGN), $$\text{DBGN} = (X_f < \text{NoiseFloor}*(1+\epsilon_3)) \quad [4.7]$$

where $\epsilon_3$ is some small positive number, see FIG. 11 (showing the switch determination of when to update the spectral noise estimate). These control variables are used to determine when the adaptive is to be updated.

UpdateSwitch Adaptive Filter Switch

We begin by calculating the energy of the rear and front cardioid to determine whether the sound is in front or behind. The front signal's energy contains the users speech. Let $Ef(m)$ and $Er(m)$ be the energy of the front and rear at frame m so $$Er(m) = \sum_{n=0}^{N-1} cr[m-n]^2 \quad [4.8]$$

$$Ef(m) = \sum_{n=0}^{N-1} cf[m-n]^2 \quad [4.9]$$

We then smooth these energies $$SmR = \lambda SmR + (1-\lambda)Er(m) \quad [4.10]$$

$$SmF = \lambda SmF + (1-\lambda)Ef(m) \quad [4.11]$$

Figure 12:
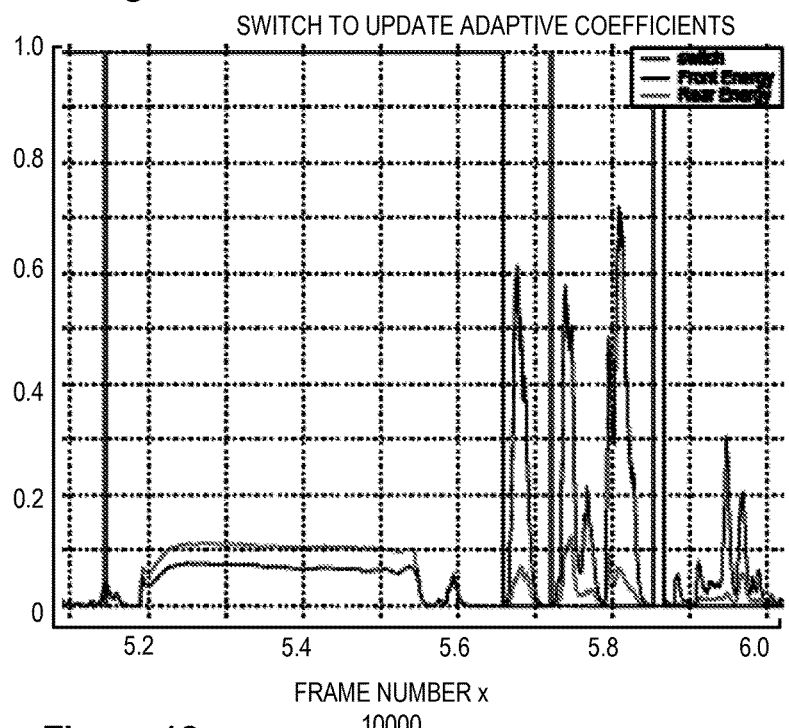
FIG. 12 is a flowchart illustrating smoothed energies for the front and rear cardioids and SW according to various embodiments of the present invention.
Figure 13:
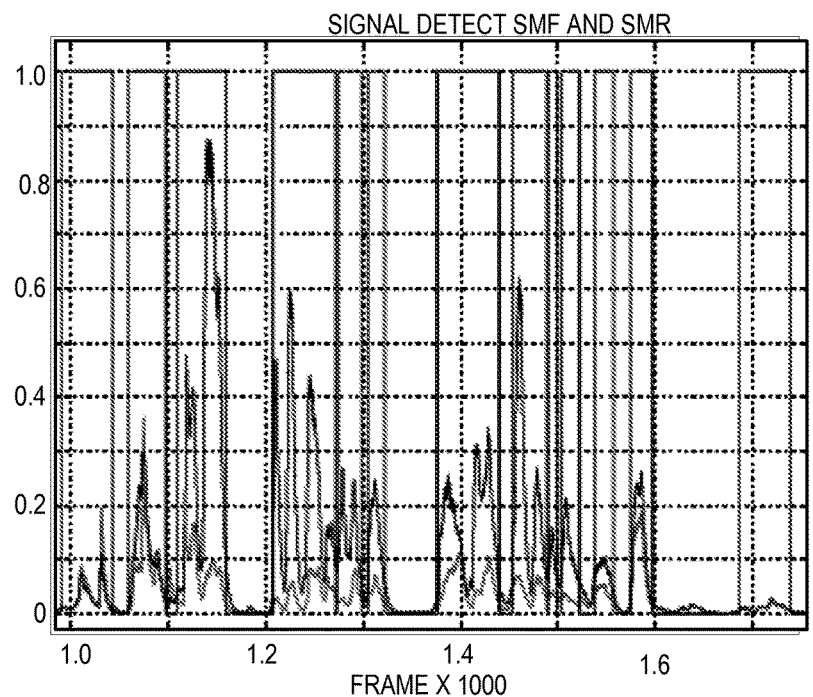
FIG. 13 is a plot illustrating the signal detect function with smoothed energies for front and rear cardioids according to various embodiments of the present invention.

So when SmR and SmF are similar both contain ambient noise and then can be little or no user speech. For local speech we estimate the front energy must be greater that 105% of the rear energy. In FIG. 12 we plot the smoothed energies for the front and rear signals. FIG. 12 illustrates the smoothed energies for the front and rear cardioids and SW). The blue signal is the adaptive switch. If the front energy falls below 105% of the rear and no noise is detected then the filter coefficients are adjusted. In FIG. 13 we plot the smoothed signal energies and signal detection switch. That is, FIG. 13 illustrates the signal detect function with smoothed energies for front and rear cardioids.

$$SW = (SmF*G < SmR)?1:0; \quad [4.12]$$

Analysis Filter Bank

Figure 14:
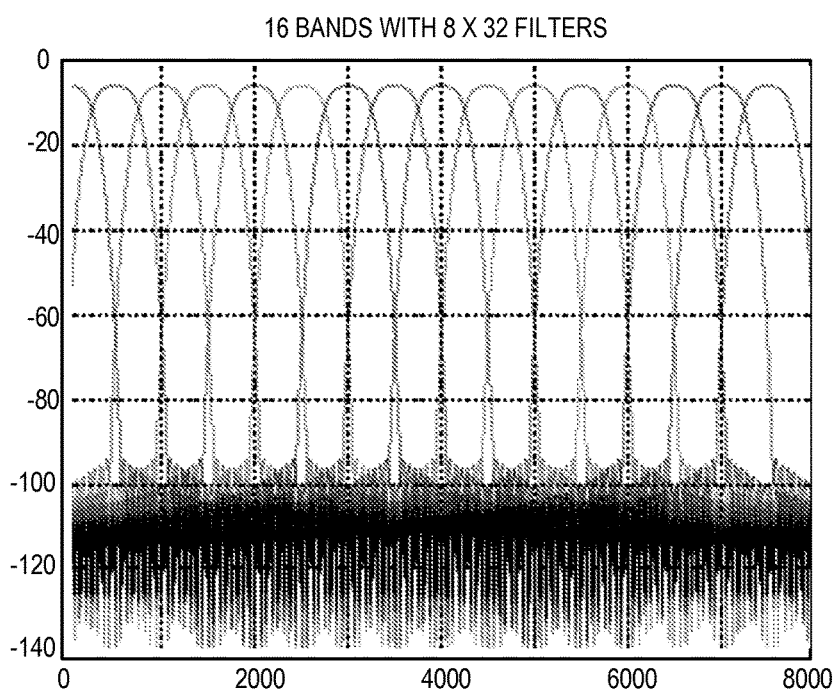
FIG. 14 is a plot illustrating spectral bands for 16 bands with a 256 reconstruction filter according to various embodiments of the present invention.

The whitened cardioid signals are fed into a Polyphase filter bank creating two spectral sets of data. We whiten the signal first using $$w(n) = x(n) - \lambda x(n-1) \quad [5.1]$$

to help decorrelate it. This helps the LMS algorithm to converge. After the synthesis reconstruction filter we do the inverse, that is $$y(n) = \lambda y(n-1) + w(n) \quad [5.2]$$

to remove this whitening and get the correct time domain signal. The filter bank has been designed to have 16 bands in the Nyquist interval for a sample rate of 16 k Hz. In FIG. 14 we show the spectral bands for a filter of length 256 samples. If we increase the length of the prototype filter we can increase the band separation. In FIGS. 15 and 16 we show longer filters, i.e. 416 samples in FIG. 15 and 512 samples in FIG. 16. We can also increase the number of bands if we wish to improve the spectral resolution. In our current implementation we use 16 bands with a filter of 256 samples. We begin by designing a low pass filter and then spectrally shift this filter to obtain the band pass filters which we implement as a polyphase filter bank.

Let $h_0(n)$ be the prototype filter so its z transform is $$H_0(z) = \sum_{n=0}^{N-1} h_0(n) z^{-n} \quad [5.3]$$

where N is the length of the filter. To create band pass filters at the frequencies $2\pi m/M$ for $0 \le m < M$ we spectral shift $h_{(0)}(k)$ to create $h_k(n)$ $$h_k(n) = h_0(n) W_M^{kn} \quad [5.4]$$

where $k = 0, 1, \ldots M_1$, M is the number of bands, and $$W_M = e^{-\frac{2i\pi}{M}}.$$

Taking the z transform of this filter we get $$H_k(z) = \sum_{n=0}^{N-1} h_k z^n \quad [5.4]$$

If we now let $n = q*M + m$, where $$0 \le m < M$$

and $$0 \le q < Q \left(Q = \frac{N}{M}\right)$$

we can express Eq 4.3 as $$H_k = \sum_{q=0}^{Q-1} \left(\sum_{m=0}^{M-1} h_0(qM+m) z^{-Mq}\right) W_M^{km} z^{-m} \quad [5.5]$$

Which we can write as $$\begin{pmatrix} H_0 \\ H_1 \\ \ldots \\ \ldots \\ H_{M-1} \end{pmatrix} = \begin{bmatrix} 1 & 1 & 1 & 1 & \ldots & 1 \\ 1 & W_M & W_m^2 & W_M^3 & \ldots & W_M^{(M-1)} \\ 1 & W_M^2 & W_M^4 & \ldots & \ldots & W_M^{2(M-1)} \\ \ldots & \ldots & \ldots & \ldots & \ldots & \ldots \\ 1 & W_M^{(M-1)} & W_M^{2(M-1)} & \ldots & \ldots & W_M^{(M-1)(M-1)} \end{bmatrix} \times \begin{pmatrix} E_0 \\ E_1 \\ \ldots \\ \ldots \\ E_{(M-1)} \end{pmatrix}$$ [5.6]

Where $$E_m(Z) = \sum_{q=0}^{Q-1} h_0(qM+m) Z^{-q}$$

Thus we can implement the filter bank using polyphase filtering and a FFT. The matrix in the above expression is in a Winograd form.

Adaptive Filter

We only want to update the adaptive coefficients when we detect ambient noise or when the rear signal is dominant, otherwise we might adapt the filters to subtract users speech. We therefore freeze the adaption if we detect local speech and this is determined by the adaptive switch. If we let $F(k)=Fr(k)+iF\,i(k)$ and $R(k)=Rr(k)+iRi(k)$ be the spectral band values for the front and rear cardioids then the estimated error is $$E(m) = \sum_{n=0}^{M} C(m) * R(m,n)$$ [5.7]

where C(k) are the complex coefficient and are updated using the normalized 1 ms method $$C(k) = C(k) + \in (k) \frac{(Err(k)^*)R(k)}{\|R^2\|}$$ [5.8]

where ϵ(k) can vary as a function of the band number and $$Err(k)=F(k)-E(k).$$ [5.9]

Figure 17:
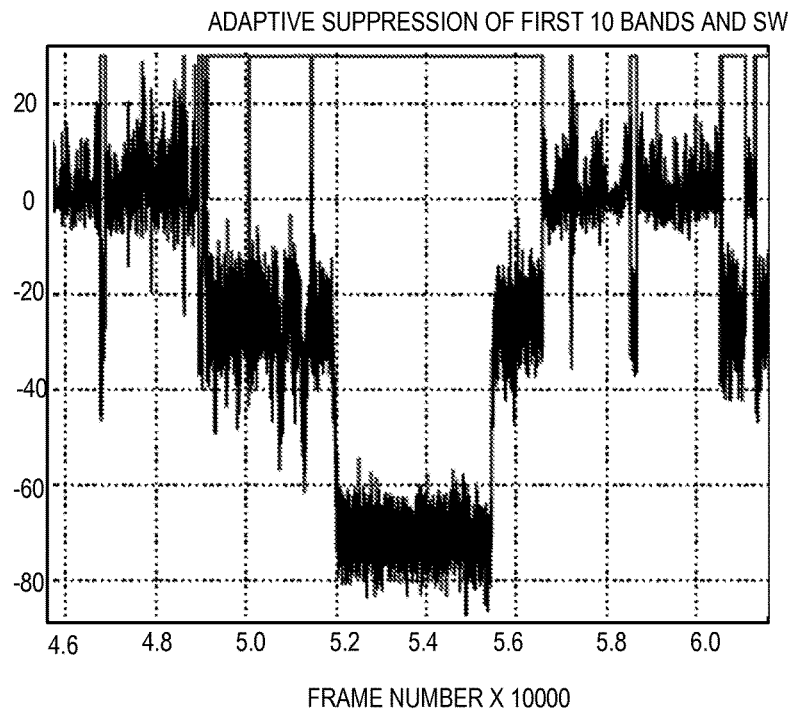
FIG. 17 is a plot illustrating the suppression of the noise and the SW switch according to various embodiments of the present invention.
Figure 18:
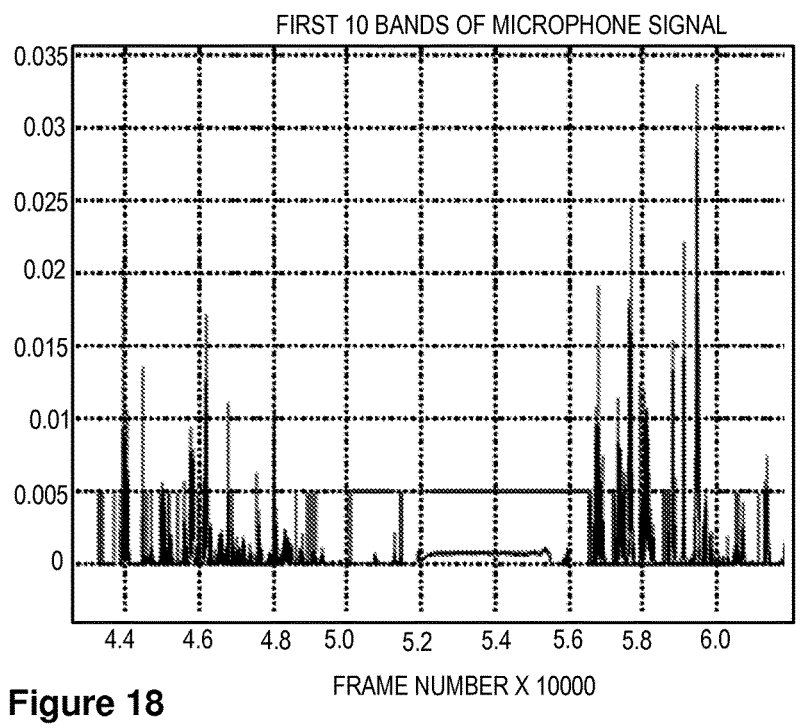
FIG. 18 is a plot showing the energy for the first 10 bands and the SW switch according to various embodiments of the present invention.
Figure 19:
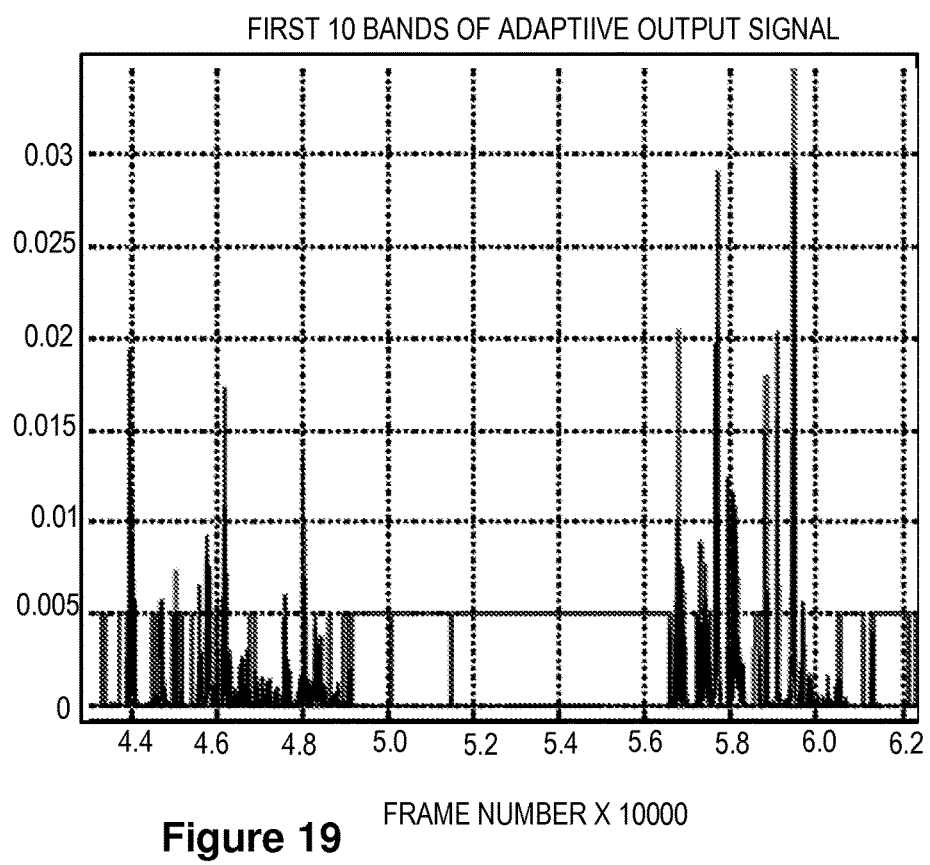
FIG. 19 is a plot showing the energy for the first 10 bands after the 1 ms estimate has been subtracted according to various embodiments of the present invention.

In FIG. 17 we show the converge of the sum of the bands energy for the first 10 bands for the adaptive filter. FIG. 17 is a plot illustrating the suppression of the noise and the SW switch. From the plot we see that when the filter is allowed to adaptive it reduces noise signal in the front cardioid by 20 dB and by as much a 30 dB for the noise starting at frame 52000.

Residual Error Suppression

We use the method of spectral subtraction to subtract the rear ambient noise estimated from the front array signal. We use two different noise floor estimates Ns[band] and Ne[band]. Ns is used when the 1 ms subtraction has been active and no user speech as been detected. The other estimate is used when the speech counter is greater than zero. This counter is decreased each time no speech is detected or set to the maximum every time it is. This counter determines a minimum speech interval but in that interval the signal may still contain speech pauses. We measure the noise floor and update for every bands during a speech pauses and the BackGroundNoise flag is true. We therefore have the following two cases:

if (BackGroundNoise and SW){Ns[band]=αNs[band]+(1−α)|Err[bands]|2;}otherwise if (BackGroundNoise){(Ne[band]=αNe[band]+(1−α)|Err[bands]|2;}.

To subtract this estimate from the bands we uses spectral subtraction. If E(k) is the energy of spectral band k we define $$g_S(K) = \left(1 - \beta_0 \sqrt{\frac{N_S(k)}{E(k)}}\right)$$ [5.10]

and $$g_F(k) = \left(1 - \beta_1 \sqrt{\frac{Ne(k)}{E(k)}}\right)$$ [5.11]

We now smooth these gains using $$SmG_S(k)=\gamma SmG_S(k)+(1"\gamma)g_S(k)$$ [5.12]

And $$SmG_F(k)=\gamma SmG_F(k)+(1-\gamma)g_F(k)$$ [5.13]

where 0<γ<1. We then adjust the spectral band k using

Error(k)=SmG_S(k)Error(k)

Or

Error(k)=SmG_F(k)Error(k)

We also initialize these gains to typical values to reduce possible artifacts.

According to a second embodiment, an apparatus and method for performing automatic and continuous calibration of an unmatched pair of microphones arranged in a known configuration and with an input source (human speaker, hereafter "talker") in a known location is provided. The amplitudes of the signals from the 2 microphones are continuously monitored. The talker is in a known location relative to the microphone pair, so the expected amplitude difference between the signals at the 2 microphones can be pre-determined, and compensated for. The talker is differentiated from input signals in other locations by applying simple heuristic metrics to the input pair. A compensating gain coefficient is derived from the relative amplitudes of the 2 microphone signals, and averaged over the long term. The averaged compensating gain is applied to one of the microphone signals to provide balanced input from the talker.

Figure 20:
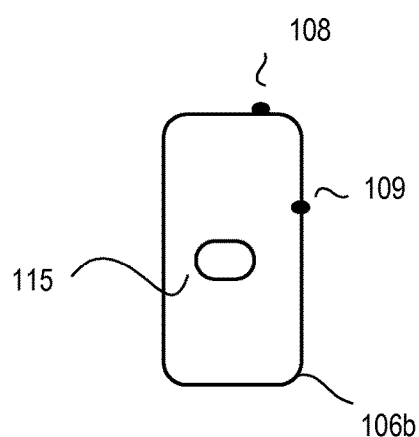
FIG. 20 is a diagram illustrating the end firing automatic calibration device according to various embodiments of the present invention.

FIG. 20 illustrates an apparatus for automatic and continuous calibration in accordance with one embodiment of the invention. A processor 115 (or processors) may be placed in an earcup 106b of the headphone to perform the various calibration functions as well as filtering functions, delay functions, comparative functions, and steering functions described herein.

Figure 21:
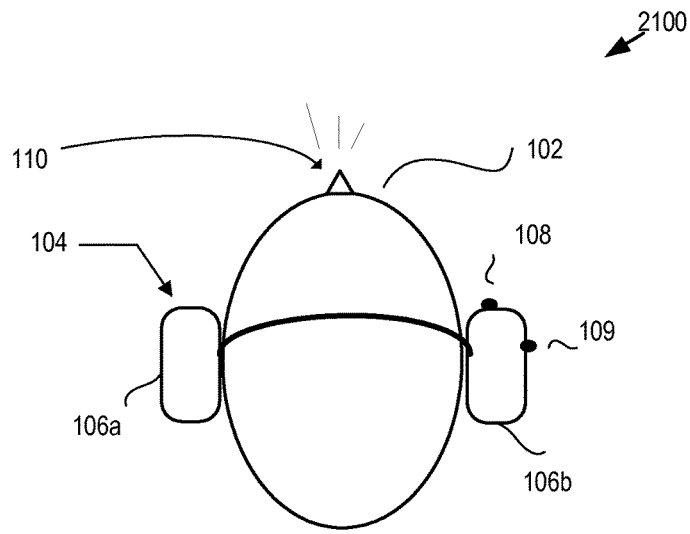
FIG. 21 illustrates an apparatus for automatic and continuous calibration in accordance with one embodiment of the invention.

FIG. 21 illustrates an apparatus for automatic and continuous calibration in accordance with one embodiment of the invention. The headset 104 is shown placed on the head of user 102. The input signal location of the talker here is shown as location 110. The headset 104 includes ear cups 106a and 106b. The dual microphones 108, 109 can be located anywhere within the configuration provided by the in-use headset 104 but preferably on the same ear cup, such as shown here on ear cup 106b. The electronics to perform the processing of the signals to calibrate the headphones can be located either within the headset 104 or externally. In a preferred embodiment the electronics are located within the headset such as within the ear cup containing the dual microphones, such as within ear cup 106b. As can be appreciated by those of skill in the relevant arts, the ear cups are typically connected by a mechanical connection such as shown in FIG. 21, which connection also sometimes houses electronic cables to communicate signals from one ear cup to the other. The headset 104 as configured is used to provide automatic and continuous calibration to the two microphones 108, 109.

Figure 22:
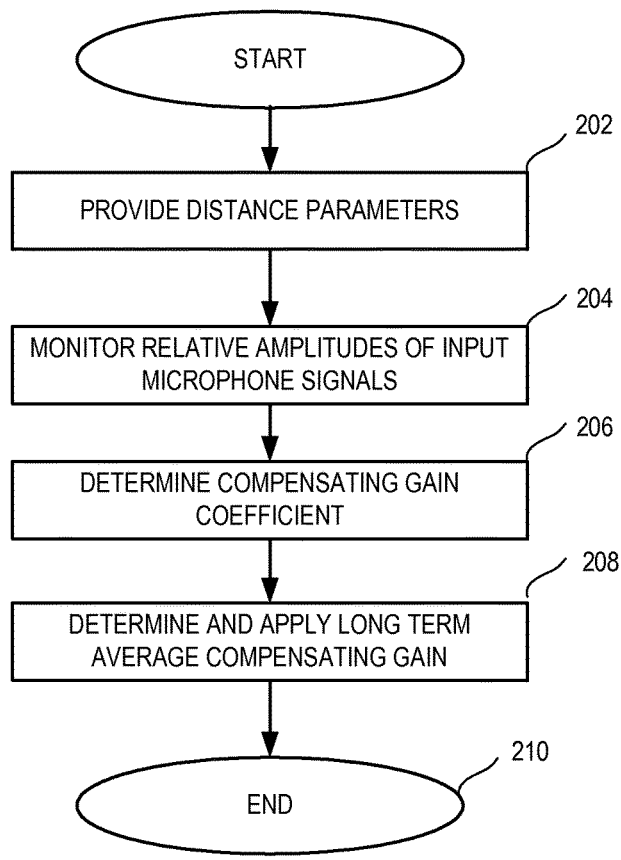
FIG. 22 illustrates a method for providing automatic and continuous calibration in accordance with one embodiment of the present invention.

FIG. 22 illustrates a method for providing automatic and continuous calibration in accordance with one embodiment of the present invention. The method starts with the recognition of the known distance parameters in step 202. That is, the method relies on the assessment of the location of the talker with respect to the two microphones. Given known location of the talker relative to the microphone pair, an expected amplitude difference between the signals at the 2 microphones can be pre-determined, and compensated for. Next the relative amplitudes of the input microphone signals from the 2 microphones are monitored in step 204. The talker is differentiated from input signals in other locations by applying simple heuristic metrics to the input pair. Next in step 206 a compensating gain coefficient is derived from the relative amplitudes of the 2 microphone signals, and averaged over the long term. A long term average compensating gain is applied in step 208 to one of the microphone signals to provide balanced input from the talker. The method ends at step 210.

Even if the mechanism for distinguishing the talker from other input sources is fooled by some non-well-formed input signal, the long term averaging of the compensating gain coefficient will keep the system from following the errant input too quickly, and will keep the system tending towards nominal and correct operation, as the normal input conditions are likely to occur more frequently than the abnormal conditions.

Several advantages are provided by the novel system:
The continuous, long term compensation for mismatched microphones provides:
  the use of less expensive (unmatched for gain) microphone pairs
  no need to perform a calibration diagnostic at the point of production (factory)
  no need to perform a calibration by the end user (customer)
  no need for persistent storage of the gain compensation value Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A microphone system comprising:
    at least two microphones in a dual microphone end firing array configuration wherein the at least two microphones and delay elements combine to form a front cardioid signal and a rear cardioid signal wherein a null of the rear cardioid is positioned to point in the direction of a desired signal and a null of the front cardioid in an opposite direction;
    a filter bank configured to separate the front cardioid signal and the rear cardioid signal into a plurality of spectral bands;
    an amplifier configured to apply a gain to the rear cardioid signal as an adaptive rear reference signal for spectral subtraction from the front cardioid, wherein said amplifier is capable of applying different gain values in different ones of the plurality of spectral bands and changes the gain values when there is no speech detected in the front cardioid; and
    a subtraction module configured to suppress noise by adaptively subtracting in the plurality of spectral bands spectral signals corresponding to the rear reference signal derived from the rear cardioid signal from the front cardioid signal.

2. The microphone system as recited in claim 1 wherein a determination is made as to whether the amplifier gain values should be updated based on the energy measured in the rear cardioid signal and front cardioid signal.

3. The microphone system as recited in claim 1 wherein an updating of the amplifier gain values provides a time variable gain that suppresses on a subband by subband basis noise.

4. The microphone system as recited in claim 1 wherein the amplifier gain values are updated when no speech is detected and the system is further configured to remove background noise by spectral subtraction of the rear cardioid reference signal from the front cardioid signal.

5. The microphone system as recited in claim 1 wherein the system is further configured to maintain in a buffer a history of the reference signal for canceling reflected noise sounds.

6. The microphone system as recited in claim 1 wherein the end firing array is positioned on a headset ear cup.

7. The microphone system as recited in claim 2 wherein amplifier gain values are updated when the rear signal is determined to be dominant.

8. The microphone system as recited in claim 1 further comprising a module performing a signal detect function that activates when the energy of the front cardioid signal falls below a threshold with respect to energy of the rear cardioid signal.

9. A method for suppressing unwanted sounds using at least 2 microphones configured in a dual microphone end firing configuration comprising:
    forming a front cardioid signal and a rear cardioid signal from the end firing array; and
    using an adaptive spectral subtraction, wherein noise is suppressed in selected spectral bands by spectrally subtracting a rear reference signal generated from the rear cardioid signal having its null facing in the direction of the desired signal, wherein the adaptive spectral subtraction involves updating coefficient values derived from the rear reference signal only when no speech is detected from the front cardioid.

10. The method recited in claim 9 wherein the method is performed in an end firing microphone array arranged on a headset and further comprising:
    using a polyphase filter bank to separate the front cardioid signal and rear cardioid signal into spectral bands.

11. The method recited in claim 9 wherein a determination is made as to whether the coefficient values should be updated based on the energy measured in the rear cardioid signal relative to the front cardioid signal.

12. The method recited in claim 9 wherein the at least two microphones are configured such that the null of the rear cardioid is positioned to point in the direction of the desired signal and the front cardioid's null points in the opposite direction, with the rear facing cardioid signal being used as a reference signal to determine any similarities between the front cardioid signal and the rear cardioid signal.

* * * * *